US007041562B2

(12) United States Patent
Lim et al.

(10) Patent No.: US 7,041,562 B2
(45) Date of Patent: May 9, 2006

(54) METHOD FOR FORMING MULTIPLE GATE OXIDE THICKNESS UTILIZING ASHING AND CLEANING

(75) Inventors: Sangwoo Lim, Austin, TX (US); Yongjoo Jeon, Austin, TX (US); Choh-Fei Yeap, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 151 days.

(21) Appl. No.: 10/696,079

(22) Filed: Oct. 29, 2003

(65) Prior Publication Data

US 2005/0093063 A1    May 5, 2005

(51) Int. Cl.
*H01L 21/311* (2006.01)

(52) U.S. Cl. ............... 438/287; 438/275; 438/591; 438/788; 438/981; 134/1.3

(58) Field of Classification Search ............ 438/199, 438/275, 283, 770, 287, 591, 771, 788, 981; 134/1.1–1.3
See application file for complete search history.

(56) References Cited

U.S. PATENT DOCUMENTS

| | | | | |
|---|---|---|---|---|
| 4,808,259 A | * | 2/1989 | Jillie et al. ............... | 438/593 |
| 5,086,017 A | * | 2/1992 | Lu ............................ | 438/586 |
| 5,190,887 A | * | 3/1993 | Tang et al. ............... | 438/264 |
| 5,631,178 A | * | 5/1997 | Vogel et al. ............. | 438/200 |
| 5,637,151 A | * | 6/1997 | Schulz ...................... | 134/2 |
| 6,093,659 A | * | 7/2000 | Grider et al. ............. | 438/758 |
| 6,261,972 B1 | | 7/2001 | Tews et al. | |
| 6,436,771 B1 | * | 8/2002 | Jang et al. ............... | 438/275 |
| 6,597,046 B1 | * | 7/2003 | Chau et al. ............... | 257/411 |
| 6,787,421 B1 | * | 9/2004 | Gilmer et al. ............ | 438/275 |
| 2003/0113959 A1 | * | 6/2003 | Min et al. ................. | 438/151 |
| 2003/0157772 A1 | * | 8/2003 | Wieczorek et al. ...... | 438/287 |
| 2004/0023506 A1 | * | 2/2004 | Pradeep et al. .......... | 438/710 |
| 2004/0102010 A1 | * | 5/2004 | Khamankar et al. ..... | 438/287 |

OTHER PUBLICATIONS

H. Lim et al., The Effects of STI Process Parameters on the integrity of Dual Gate Oxides. IEEE 2001, pp. 48-51.*

* cited by examiner

*Primary Examiner*—Anh Duy Mai
(74) *Attorney, Agent, or Firm*—Joanna G. Chiu; Michael J. Balconi-Lamica

(57) ABSTRACT

Embodiments of the present invention relate to semiconductor structures having multiple gate dielectric structures. One embodiment forms semiconductor devices in multiple regions having different dielectric thicknesses where the interface between the gate dielectric and the semiconductor substrate is protected to result in an improved (e.g. less rough) interface. One embodiment includes forming a dielectric layer overlying a substrate, partially etching the dielectric layer in at least one of the multiple regions, and ashing the dielectric layer. The remaining portion of the dielectric layer (due to the partial etch) may then help protect the underlying substrate from damage during a subsequent preclean. Afterwards, in one embodiment, the gate dielectric layer is grown to achieve a target gate dielectric thickness in at least one of the regions. This may also help further densify the gate dielectric layer. Processing may then be continued to form semiconductor devices in each of the multiple regions.

23 Claims, 3 Drawing Sheets

METHOD FOR FORMING MULTIPLE GATE OXIDE THICKNESS UTILIZING ASHING AND CLEANING

FIELD OF THE INVENTION

The present invention relates generally to semiconductor processing, and more specifically, to a semiconductor structure having multiple gate dielectric thicknesses.

RELATED ART

As semiconductor technology continues to evolve, the sizes of semiconductor devices are becoming increasingly smaller. For example, in order to improve semiconductor device performance, the gate dielectric thickness is becoming increasingly thinner. However, as the gate dielectric becomes thinner, gate leakage becomes a larger concern. Furthermore, as the gate dielectric becomes thinner, the quality of the interface between the gate dielectric and the underlying semiconductor substrate becomes increasingly important for device performance. In current semiconductor processes having multiple gate dielectrics, semiconductor circuits are formed with devices having different gate dielectric thicknesses, such as in dual-gate-oxide (DGO) integration or triple-gate-oxide (TGO) integration. For example, in DGO integration, devices have one of two different gate oxide thicknesses. For example, input/output (I./O) devices may have one gate oxide thickness (e.g. a thicker gate oxide thickness) while core devices may have a different gate oxide thickness (e.g. a thinner gate oxide thickness).

In the formation of conventional DGO integration, a complete etch of the oxide is used to define the thicker gate oxide. However, the complete etching of the gate oxide to define the thicker gate oxide of the DGO integration and the subsequent preclean steps attack the exposed surfaces of the semiconductor substrate. For example, the surfaces of the semiconductor substrate exposed during the complete etch become rough. After the complete etching of the gate oxide and the precleans, a subsequent oxide layer is grown on the rough exposed surface of the semiconductor substrate which will be used as the thinner gate oxide of the DGO integration. However, due to the roughness of the semiconductor substrate at the interface between the semiconductor substrate and the subsequently grown gate oxide, the resulting device formed with the thinner gate oxide has reduced performance and increased leakage current.

Furthermore, in the formation of conventional TGO integration, the above described complete etch and subsequent preclean steps are again performed to define a third, and generally thinner, gate oxide as opposed to the first two gate oxides. This subsequent complete etch and preclean further attacks the exposed surfaces of the semiconductor substrate which further degrades performance of those devices using the third gate oxide as the gate dielectric since, for example, the surface is even rougher than before and the third oxide is generally thinner.

Therefore, a need exists for an improved process for forming semiconductor circuits or structures having multiple gate dielectric regions (where, for example, each of the multiple gate dielectric regions have different gate dielectric thicknesses).

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As semiconductor technologies continue to evolve, the gate dielectrics of semiconductor devices become increasingly thin. The quality of the interface between the surface of the semiconductor substrate and the gate dielectric affects performance of the semiconductor device. For example, if the interface is rough, which may occur during etching or precleaning as was described above, device performance may be negatively impacted. As the gate dielectrics become increasingly thinner, the quality of the interface becomes increasingly important. That is, typically, the thinner the gate dielectric, the more impact a rough interface has on device performance. Therefore, one embodiment described herein applies to a semiconductor structure having multiple gate dielectric regions where in each region, the gate dielectric has a different thickness. One embodiment uses a partial etch and ashing in order to improve the interface between the gate dielectric, as will be described in more detail below.

Figure 1:
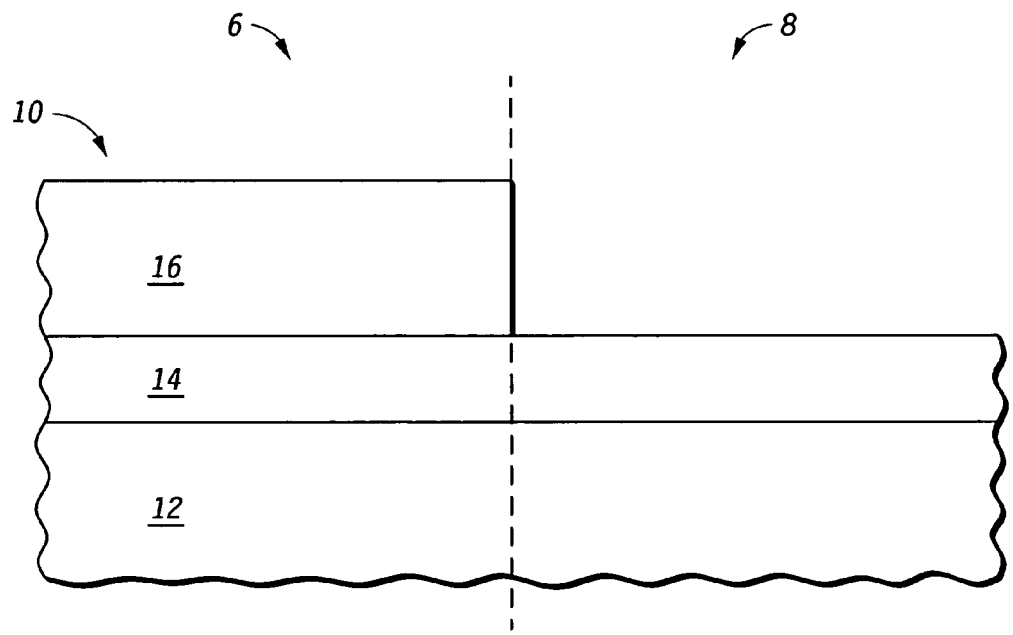
FIG. 1 illustrates a cross-sectional view of a semiconductor structure having multiple gate dielectric regions, a gate dielectric layer overlying a substrate, and a patterned masking layer overlying the gate dielectric layer in accordance with one embodiment of the present invention.

FIG. 1 illustrates a semiconductor structure 10 having a semiconductor substrate 12, a gate dielectric layer 14 overlying substrate 12, and a patterned masking layer overlying gate dielectric layer 14. In the illustrated embodiment, semiconductor structure 10 includes two gate dielectric regions 6 and 8. Region 6 corresponds to a region in which the devices will have a first gate dielectric thickness, and region 8 corresponds to a region in which the devices will have a second gate dielectric thickness that is generally different from the first gate dielectric thickness. In one embodiment, the gate dielectrics of region 6 are thinner as compared to the gate dielectrics of region 8. For example, in one embodiment, regions 6 and 8 correspond to gate dielectric regions in a DGO integration where the devices formed in region 8 correspond to I/O devices and the devices formed in region 6 correspond to core devices or high performance devices. In an alternate embodiment, regions 6 and 8 may correspond to gate dielectric regions in a TGO integration where a third region (not illustrated) also exists, where the gate dielectrics of the devices in the third region have a different gate dielectric thickness than those in regions 6 and 8. Regions 6 and 8 may correspond to two regions in any multiple gate-oxide integration having any number of gate dielectric regions.

In one embodiment, semiconductor substrate 12 may include silicon. Alternatively, semiconductor substrate 12 may include any other type of semiconductor material such as, for example, silicon germanium, gallium arsenide, etc. Also, semiconductor substrate 12 may be a bulk substrate or may be a silicon-on-insulator (SOI) substrate. Alternatively, substrate 12 may be any other semiconductor-on-insulator substrate. In one embodiment, gate dielectric layer 14 includes an oxide, such as, for example, silicon dioxide. In one embodiment, gate dielectric layer 14 may be deposited. In another embodiment, gate dielectric layer 14 may be grown over substrate 12 to form, for example, a thermal oxide. In one embodiment, the thickness of gate dielectric layer 14 corresponds to at least the desired thickness of the thicker gate dielectric of region 6. For example, in one embodiment, gate dielectric layer 14 has a thickness in a range of approximately 30 to 70 Angstroms. Patterned masking layer 16, in one embodiment, is a patterned photo resist layer, which is used to define the portions of gate dielectric layer 14 which correspond to the different regions, such as regions 6 and 8. Conventional processes may be used to form patterned masking layer 16.

Note that although not illustrated in FIG. 1, substrate 12 may include isolation regions and well implants, as known in the art, as needed for subsequent formation of semiconductor transistors.

Figure 2:
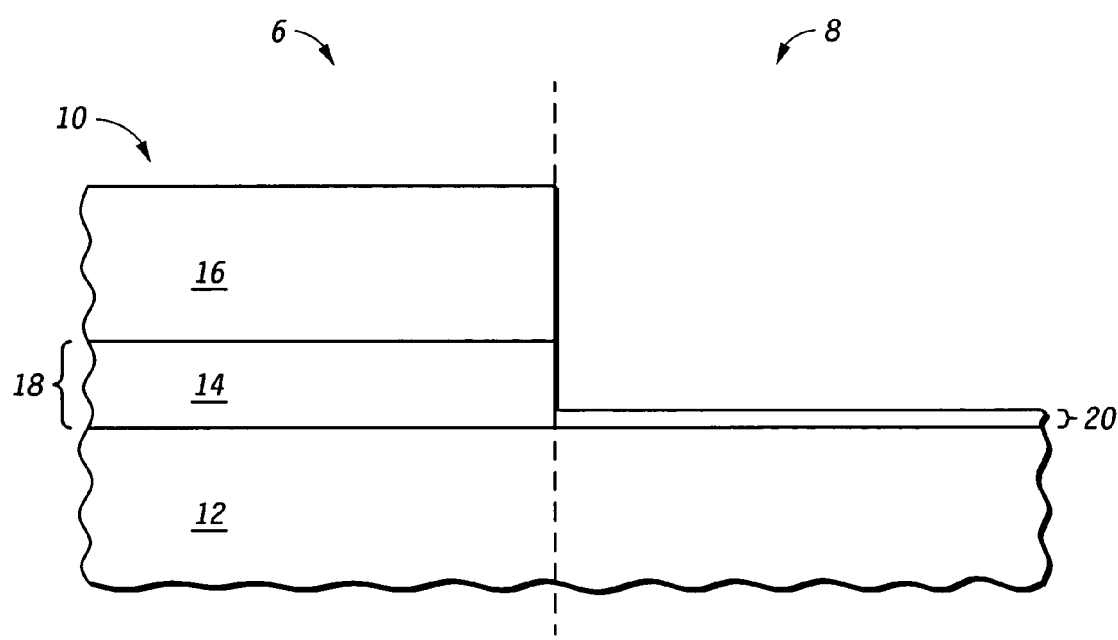
FIG. 2 illustrates a cross-sectional view of the semiconductor structure of FIG. 1 after removing a portion of the gate dielectric layer in accordance with one embodiment of the present invention.

FIG. 2 illustrates semiconductor structure 10 after partial removal of a gate dielectric layer 14 to form gate dielectric portion 18 and gate dielectric portion 20 of gate dielectric layer 14 in regions 6 and 8, respectively. Therefore, note that gate dielectric portion 18 is thicker as compared to gate dielectric portion 20. In one embodiment, the thickness of remaining gate dielectric portion 20 in region 8 corresponds to the desired thickness of the gate dielectrics in region 8. That is, in one embodiment, the thickness of gate dielectric portion 20 is selected such that, after subsequent processing, the resulting devices in region 8 result in having the desired target gate dielectric thickness for region 8. In one embodiment, the thickness of gate dielectric portion 20 is in a range of approximately 5 to 10 Angstroms or on the order of less than approximately 10 Angstroms. This thickness may also be referred to as a first intermediate thickness. Note that conventional etch processes may be used to remove portions of gate dielectric layer 14.

Figure 3:
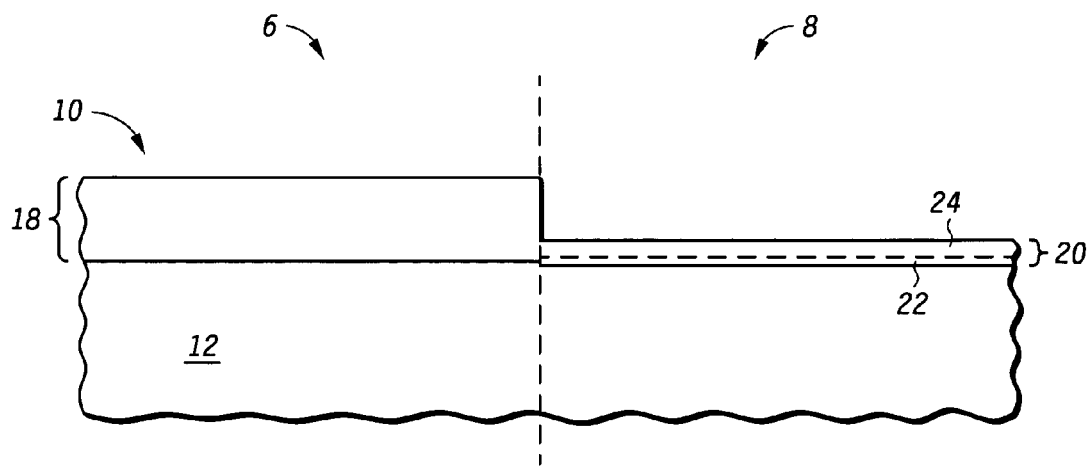
FIG. 3 illustrates a cross-sectional view of the semiconductor structure of FIG. 2 after ashing, in accordance with one embodiment of the present invention.

FIG. 3 illustrates semiconductor structure 10 after ashing. The ashing removes patterned masking layer 16 and also results in the growth of additional dielectric 22 at the surface of substrate 12. Dielectric 24 corresponds to the remaining portion of gate dielectric layer 14 after etching. Therefore, gate dielectric portion 20 now includes grown dielectric 22 and overlying dielectric 24. In one embodiment, after ashing, gate dielectric portion 20 has a thickness in a range of approximately 15 to 20 Angstroms, or, in one embodiment, on the order of 18 Angstroms. This thickness may also be referred to as a second intermediate thickness. Note that in one embodiment, additional dielectric 22 is an oxide which may be referred to as an oxygen plasma ash oxide or a plasma oxide, and dielectric 24 is a grown oxide which may be referred to as a thermal oxide. The dotted line within gate dielectric portion 20 indicates the division between the grown dielectric during the ashing (dielectric 22) and the previously existing dielectric (dielectric 24); however, note that the dotted line may not represent an actual physical distinction. After ashing, a post-ash clean may be performed to remove residue, such as, for example, photo resist residue. In one embodiment, this post-ash clean uses a Sulfuric Acid Peroxide Mixture (SPM).

Figure 4:
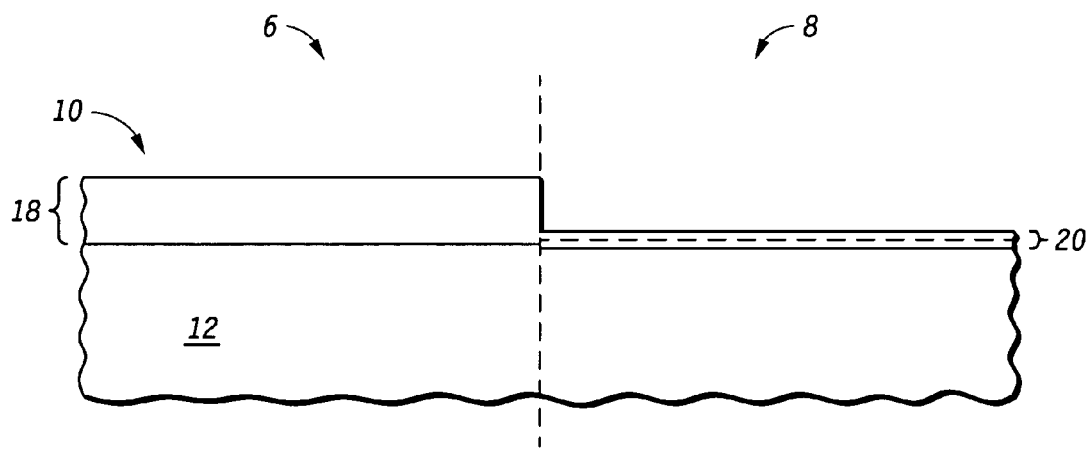
FIG. 4 illustrates a cross-sectional view of the semiconductor structure of FIG. 3 after a preclean, in accordance with one embodiment of the present invention.

FIG. 4 illustrates semiconductor structure 10 after a preclean which may result in the thinning of gate dielectric portions 18 and 20. (Note that the precleaning of substrate 12 may also be referred to as a cleaning of substrate 12). Therefore, note that gate dielectric portions 18 and 20 of FIG. 4 are thinner as compared to the gate dielectric portions 18 and 20 of FIG. 3. In one embodiment, after the preclean, the thickness of gate dielectric portion 20 is in a range of approximately 11 to 15 Angstroms. This thickness may also be referred to as a third intermediate thickness. In one embodiment, the preclean includes an SPM clean, an Ammonia Peroxide Mixture (APM) clean, and a Hydrochloric Peroxide Mixture (HPM) clean. In one embodiment, these are each performed sequentially in the order of SPM, APM, and HPM. In one embodiment, each of the SPM clean, APM clean, and HPM clean is performed for approximately 10 minutes. In one embodiment, the duration of the preclean (e.g. of each of SPM clean, APM clean, and HPM clean) is selected such that the preclean does not affect the interface between gate dielectric portion 20 and the surface of substrate 12. That is, in one embodiment, the preclean is performed such that it does not affect the surface roughness of substrate 12. For example, in one embodiment, the APM clean is of a limited time duration that is determined as a function of a beginning thickness of the gate dielectric layer prior to the preclean and a desired ending thickness of the gate dielectric layer after the preclean.

Figure 5:
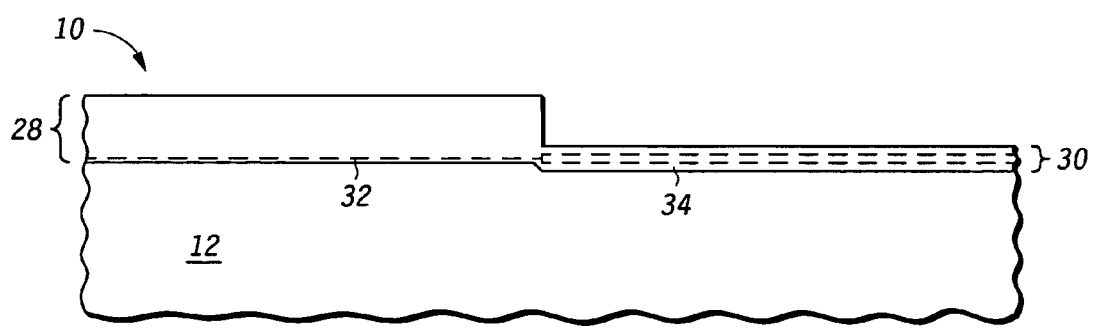
FIG. 5 illustrates a cross-sectional view of the semiconductor structure of FIG. 4 after growing the gate dielectric layer, in accordance with one embodiment of the present invention.

FIG. 5 illustrates semiconductor structure 10 after growing gate dielectric portions 18 and 20. Therefore, in one embodiment, gate dielectric portions 18 and 20 are thermally oxidized to form gate dielectric portions 28 and 30. Note that portions of substrate 12 are consumed during the growing of the gate dielectric thus resulting in thicker gate dielectric portions 28 and 30 (as compared to gate dielectric portions 18 and 20 of FIG. 4). Note that portions 32 and 34 below the dotted lines indicate the portions of substrate 12 consumed during the growing of the dielectric layer. Therefore, as in FIGS. 3 and 4, the dotted lines in FIG. 5 represent portions of the gate dielectric layer formed in different processes, but may not necessarily represent physical distinctions within the layer. In one embodiment, where gate dielectric layer 14 is a thermal oxide, portions 32 and 34 are also thermal oxides. In this embodiment, note that thermal oxide 24 (a portion of gate dielectric layer 14) and plasma oxide 22 are further densified during formation of thermal oxides 32 and 34. In one embodiment, gate dielectric portion 28 has a thickness in a range of approximately 30 to 70 Angstroms, and gate dielectric portion 30 has a thickness in a range of approximately 13 to 17 Angstroms. In one embodiment, the thickness of gate dielectric portion 30 is approximately 14 to 15 Angstroms. These thicknesses may correspond, for example, to the desired or target gate dielectric thicknesses of regions 6 and 8.

Figure 6:
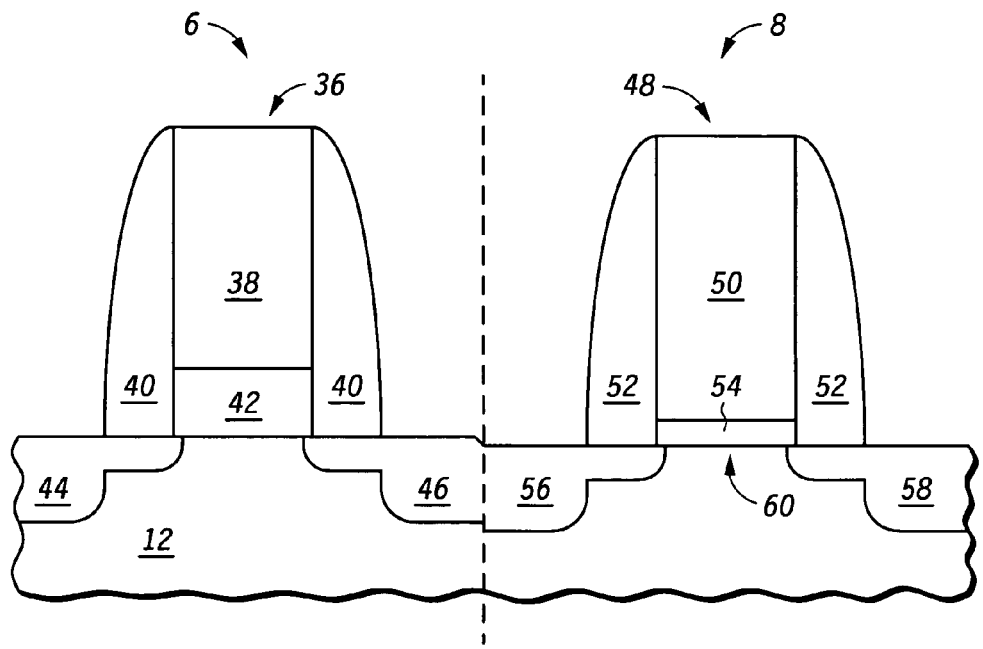
FIG. 6 illustrates a cross-sectional view of the semiconductor structure of FIG. 5 after formation of a semiconductor device in each of the gate dielectric regions, in accordance with one embodiment of the present invention.

FIG. 6 illustrates semiconductor structure 10 after formation of semiconductor device 36 in region 6 and semiconductor device 48 in region 8. Device 36 includes a gate dielectric 42 (formed from gate dielectric portion 28 of FIG. 5), a gate electrode 38 overlying gate dielectric 42, and sidewall spacers 40 adjacent each side of gate dielectric 42 and gate electrode 38. Device 36 also includes source/drain regions 44 and 46 in substrate 12 underlying spacers 40 and a portion of gate dielectric 42. Device 48 includes a gate dielectric 54 (formed from gate dielectric portion 30 of FIG. 5), a gate electrode 50 overlying gate dielectric 54, and sidewall spacers 52 adjacent each side of gate dielectric 54 and gate electrode 50. Device 48 also includes a source/drain region 56 and a source/drain region 58 in substrate 12 underlying spacers 52 and a portion of gate dielectric 54. Interface 60 corresponds to the interface between gate dielectric 54 and the surface of substrate 12. Therefore, note that, in one embodiment, gate dielectric 42 includes a first thermal oxide (e.g. a portion of gate oxide 18) and a second thermal oxide (e.g. a portion of gate oxide 32), and gate dielectric 54 includes a composite of the first thermal oxide (e.g. a portion of gate oxide 24), a plasma oxide (e.g. a portion of gate oxide 22), and the second thermal oxide (e.g. a portion of gate oxide 34).

As described above, substrate 12 may include implanted well regions prior to formation of devices 36 and 48. Therefore, in one embodiment, substrate 12 may be implanted differently for device 36 than for device 48. Furthermore, although not illustrated in FIG. 6, isolation trenches are generally used between devices in order to electrically isolate the devices. Therefore, the dotted line in FIG. 6 is used to illustrate both devices; however, there may be additional circuitry between device 36 and 48 or they may be isolated with a trench isolation region (not shown). Note that each of devices 36 and 48 may be any type of device having different gate dielectric thicknesses. That is, the gate electrodes 38 and 50 may be any appropriate gate electrode or gate stack, and may be formed from a variety of different materials. Also, spacers 40 and 52 may be formed of a single material or of multiple materials. For example, in one embodiment, each of spacers 40 and 52 may include a liner layer (not shown). Also, each of devices 36 and 48 may have any polarity. For example, they may each be either an NMOS type device or a PMOS type devices. Note that after formation of gate dielectric portion 28 and gate dielectric portion 30 of FIG. 5, conventional processing may be used to form the rest of devices 36 and 48.

Figure 7:
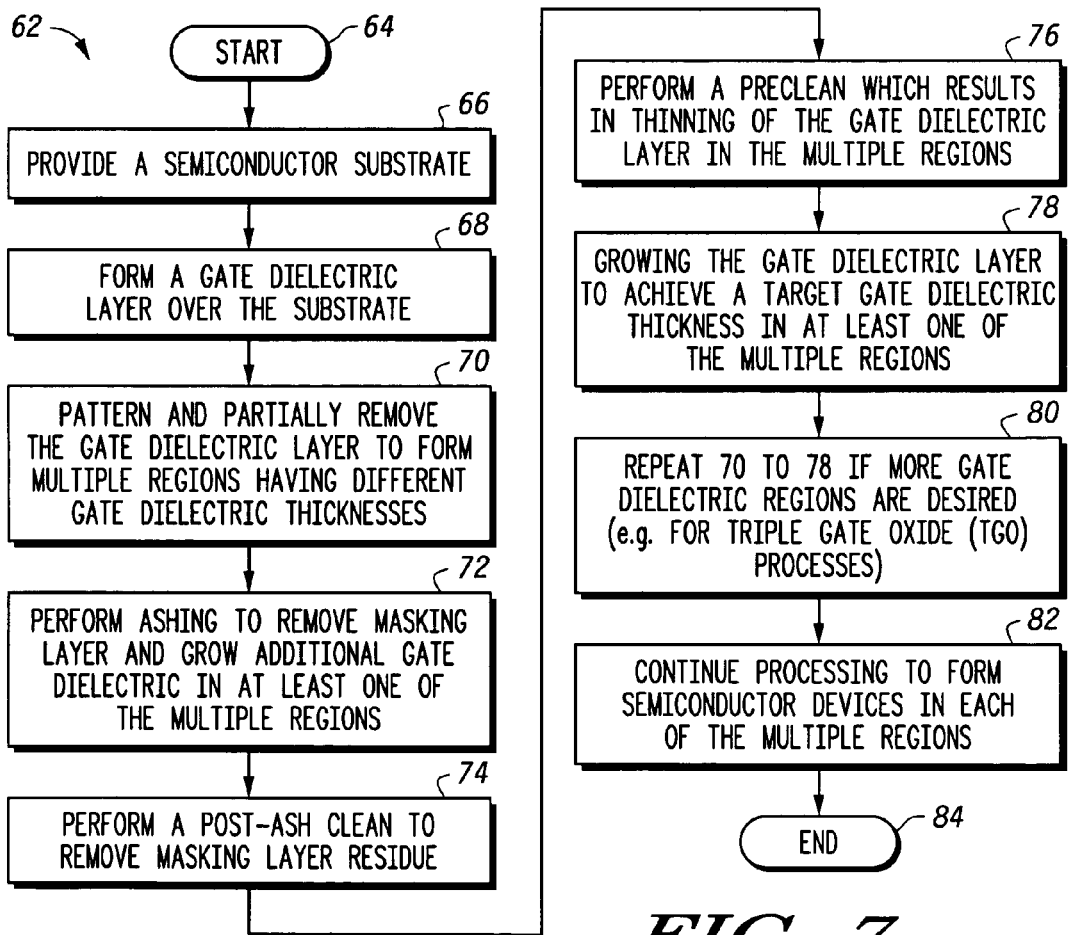
FIG. 7 illustrates a process flow for forming the semiconductor structure of FIGS. 1–6 in accordance with one embodiment of the present invention.

FIG. 7 illustrates a process flow 62 in accordance with one embodiment of the present invention which may be used to form the semiconductor structure of FIGS. 1–6. Process flow 62 begins with start oval 64 and proceeds to block 66 where a semiconductor substrate is provided (such as, for example, semiconductor substrate 12 described above in reference to FIG. 1). Flow then proceeds to block 68 where a gate dielectric layer (such as, for example, gate dielectric layer 14 described above in reference to FIG. 1) over the substrate. Flow then proceeds to block 70 where the gate dielectric layer is patterned and partially removed to form multiple regions (such as, for example, regions 6 and 8 described above) having different gate dielectric thicknesses. For example, as described above in reference to FIGS. 1 and 2, a masking layer such as masking layer 16 may be used to pattern the gate dielectric layer and then a partial etch of gate dielectric layer 14, resulting in remaining portion 20, may be performed.

Referring back to FIG. 7, flow then proceeds to block 72 where ashing is performed to removed the masking layer used in block 70. Also in block 72, an additional gate dielectric is grown in at least one of the multiple regions. For example, in FIG. 3 described above, grown dielectric 22 (such as, for example, a plasma oxide) is grown in region 8. After block 72, flow proceeds to block 74 where a post-ash clean is performed to remove any masking layer residue (as was described, for example, above in reference to FIG. 3). Flow then proceeds to block 76 where a preclean is performed which results in thinning of the gate dielectric layer in the multiple regions. For example, as described above in reference to FIG. 4, gate dielectric portions 18 and 20 are thinned after the preclean.

Referring back to FIG. 7, flow then proceeds to block 78 where the gate dielectric layer is again grown in at least one of the multiple regions to achieve a target gate dielectric thickness. For example, as described above in reference to FIG. 5, the gate dielectric layers are grown in regions 6 and 8 to form gate dielectric portions 28 and 30, where at least one of gate dielectric portion 18 and gate dielectric portion 30 has achieved a target or desired gate dielectric thickness. For example, in one embodiment, the gate dielectric layer is grown until gate dielectric portion 30 achieves a target or desired gate dielectric thickness.

Flow then proceeds from block 78 to block 80 where blocks 70 to 78 (i.e. blocks 70, 72, 74, 76, and 78) are repeated if more gate dielectric regions are desired, such as, for example, for TGO processes. For example, referring to FIG. 5, the processes of blocks 70 to 78 can be repeated using gate dielectric portion 30, where gate dielectric portion 30 can be further divided into two gate dielectric regions having different gate dielectric thicknesses. The processes of blocks 70 to 78 would then be performed in the two regions of gate dielectric portion 30 (with gate dielectric portion 30 being analogous to gate dielectric layer 14, and the two regions of gate dielectric portion 30 being analogous to regions 6 and 8). Therefore, a third region would result (not shown) having a gate oxide thickness that is thinner than the thickness of gate dielectric portion 30. Note that the processes of blocks 70 and 78 can be repeated to form as many gate dielectric regions as desired.

After block 80, flow continues to block 82 where processing is continued to form semiconductor devices in each of the multiple gate dielectric regions. For example, device such as devices 36 and 48 may be formed in the multiple regions, where at least one device would be formed in each reasons. Note that the devices in different regions would have a different resulting gate oxide thickness, such as gate oxides 42 and 54 which have different thicknesses.

Therefore, as can be appreciated, the partial removal of gate dielectric layer 14 (leaving behind gate dielectric portion 20 of FIG. 2), may allow for an improved interface 60. That is, since gate dielectric portion 20 remains after etching of gate dielectric layer 14, this remaining portion 20 protects the underlying surface of substrate 12 from the roughening due to the dielectric etching and due to the subsequent cleaning (such as, for example, the post-ash cleaning and the precleaning described above). Furthermore, the ashing described above in reference to FIG. 3, may also allow for an improved interface 60 by creating an additional layer of protection (such as dielectric portion 22 of FIG. 3) for substrate 12 which further helps to protect the underlying surface of substrate 12. Note that the additional layer of protection may also prevent the diffusion of chemicals during precleaning of substrate 12 which can also result in the roughening of the underlying surface of substrate 12.

Also, the additional layer of protection formed during ashing (such as dielectric portion 22) may prevent the formation of a chemical dielectric (such as a chemical oxide) during subsequent precleaning (such as during the subsequent application of SPM, APM, and HPM cleans, described above). That is, in one embodiment, due to the additional layer of protection overlying substrate 12, thermal oxides are formed (corresponding, for example, to dielectric portions 22, 24, and 34) rather than chemical oxides (which would be formed if a complete etch rather than a partial etch of gate dielectric layer 14 were performed in region 8). Generally, note that a thermal oxide provides a more robust oxide as compared to a chemical oxide, thus resulting in an improved gate dielectric having reduced leakage current. Also, in this embodiment, since thermal oxides are formed, they are further densified during the final oxidation (the oxidation performed, for example, in block 78 of FIG. 7, and as described above in reference to FIG. 5 for the formation of oxide portion 34). This may further help improve the quality of the gate dielectrics.

Also, note that in one embodiment, interface 60, which has been protected through the partial etch of gate dielectric layer 14 and the ashing of substrate 12, is less rough as compared to conventional processes which perform a complete etch of the gate dielectric layer. Therefore, in one embodiment, the surface roughness of interface 60 is preserved throughout processing. That is, in this embodiment, the resultant roughness of interface 60 is substantially similar to the initial surface roughness of interface 60. For example, in one embodiment, the remaining portions of gate dielectric layer 14 in region 8 after the partial etch of gate dielectric layer 14 prevents the underlying dielectric layer/substrate interface from subsequently being breached by an etchant. Therefore, interface 60 may result in an improved quality interface. In one embodiment, the improved quality interface may result in increased device performance.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a multigate dielectric structure for a semiconductor device, said method comprising:

providing a substrate, the substrate having a surface with a first surface roughness;

providing a dielectric layer overlying the substrate and forming a dielectric/substrate interface between the dielectric layer and the substrate at the surface of the substrate, the dielectric layer having an initial thickness;

forming a patterned photoresist overlying the dielectric layer and the substrate, the patterned photoresist defining a region for formation of a gate dielectric of a desired target thickness;

etching the region so that a portion of the dielectric layer remains within the region, wherein the portion of remaining dielectric layer within the region has a first intermediate thickness, the first intermediate thickness being less than the initial thickness and being less than approximately ten Angstroms;

ashing the portion of remaining dielectric layer within the region, wherein ashing causes an increase in thickness of the dielectric layer remaining within the region from the first intermediate thickness to a second intermediate thickness, the second intermediate thickness being in a range of approximately 15 to 20 Angstroms;

cleaning the portion of the dielectric layer remaining within the region, wherein cleaning causes a decrease in thickness of the dielectric layer remaining within the region from the second intermediate thickness to a third intermediate thickness; and thermally oxidizing the dielectric layer, wherein thermally oxidizing causes the portion of remaining dielectric layer within the region to have a desired target thickness, and further wherein the thermal oxidation increases a density of the portion of remaining dielectric layer.

2. The method of claim 1, wherein the substrate includes one of a bulk substrate and an SOI substrate.

3. The method of claim 1, wherein the dielectric layer includes a silicon dioxide layer.

4. The method of claim 1, wherein the region includes a high performance device region.

5. The method of claim 1, wherein the portion of the dielectric layer remaining within the region further prevents the dielectric/substrate interface from subsequently being breached by an etchant.

6. The method of claim 1, wherein ashing further includes ashing the patterned photoresist for removing the patterned photoresist.

7. The method of claim 1, wherein the second intermediate thickness is on the order of eighteen (18) Angstroms.

8. The method of claim 1, wherein ashing includes exposing the portion of remaining dielectric layer to an oxygen plasma.

9. The method of claim 1, further comprising subsequent to ashing, performing a post-ashing clean.

10. The method of claim 9, wherein the post-ashing clean includes use of a sulfuric acid peroxide mixture (SPM).

11. The method of claim 1, wherein cleaning includes a preclean.

12. The method of claim 11, wherein a duration of the preclean is selected such that the preclean does not affect the first surface roughness of the substrate layer within the region.

13. The method of claim 11, wherein the preclean is maintained for a given duration without affecting a surface roughness of the dielectric/substrate interface.

14. The method of claim 11, wherein the preclean includes a piranha clean, followed by an ammonium peroxide mixture (APM) clean and a hydrochloric acid peroxide mixture (HPM) clean.

15. The method of claim 14, further wherein the APM clean is of a limited time duration, the limited time duration being determined as a function of a beginning thickness and a desired target ending thickness.

16. The method of claim 14, wherein the piranha clean includes use of a sulfuric acid peroxide mixture (SPM).

17. The method of claim 1, wherein the third intermediate thickness is in on the order of eleven (11) to fifteen (15) Angstroms.

18. The method of claim 1, wherein the dielectric layer includes a first thermal oxide, and wherein thermal oxidation of the dielectric layer forms a second thermal oxide at the dielectric/substrate interface, wherein the portion of the dielectric layer remaining within the region includes a composite of the first thermal oxide, a plasma oxide, and the second thermal oxide, and wherein thermal oxidation further densifies the first thermal oxide and the plasma oxide of the composite remaining within the region.

19. The method of claim 1, further wherein a surface roughness of the dielectric/substrate interface is substantially preserved.

20. The method of claim 19, wherein the substantially preserved dielectric/substrate surface roughness is a resultant surface roughness of the dielectric/substrate interface within the region that is substantially similar to the initial surface roughness of the dielectric/substrate interface.

21. The method of claim 1, wherein the portion of remaining dielectric layer is devoid of chemical oxide incorporation at the dielectric/substrate interface.

22. The method of claim 1, wherein the method includes one of a dual gate oxide (DGO) process and a triple gate oxide (TGO) process.

23. The method of claim 1, further comprising forming a semiconductor device structure using a portion of the portion of remaining dielectric layer within the region as a gate dielectric and forming another semiconductor device structure using a portion of the dielectric layer outside the region as a gate dielectric.

* * * * *